United States Patent [19]
Lomashevich

[11] Patent Number: 5,475,704
[45] Date of Patent: Dec. 12, 1995

[54] OPTICAL PROCESSOR WITH BOOSTER OUTPUT

[75] Inventor: Svyatoslav A. Lomashevich, Sankt Petersburg, Russian Federation

[73] Assignee: Samsung Electronics Co., Ltd., Suwon, Rep. of Korea

[21] Appl. No.: 278,287

[22] Filed: Jul. 21, 1994

[30] Foreign Application Priority Data

Jul. 21, 1993 [RU] Russian Federation ............ 9303705.5

[51] Int. Cl.$^6$ .................................................... H01S 3/08
[52] U.S. Cl. .................. 372/92; 372/21; 372/26; 372/64; 372/94
[58] Field of Search ................... 372/92, 94, 12, 372/21, 26, 64

[56] References Cited

U.S. PATENT DOCUMENTS 4,546,244 10/1985 Miller ........................................ 372/12

5,001,523 3/1991 Lomashevich et al. .................. 372/94

OTHER PUBLICATIONS

"High Gain Signal Amplification In An InSb Transphasor at 77 K" by F. A. P. Tooley; S. D. Smith, and C. T. Seaton, Appl. Phys. Lett. 43(9), 1 Nov. 1983.
"Electrically Active Optical Bifurcation: BOA" by M. Papychon and Am. Roy Applied Physics Letters, vol. 31, No. 4, 15 Aug. 1977.

Primary Examiner—Leon Scott, Jr.
Attorney, Agent, or Firm—Robert A. Westerlund; Stephen R. Whitt; Charles R. Donohoe

[57] ABSTRACT

A nonlinear optical device, operating in an optical bistability mode, capable of carrying out amplification, commutation, switching and computing of optical signals, comprises, a pair of directional couplers formed by optically coupling a pair of waveguides and a pair of nonlinear circular resonators and an optical transistor incorporating an optical mixer of bifurcation optical active type capable of functioning also as a phase modulator.

20 Claims, 9 Drawing Sheets

OPTICAL PROCESSOR WITH BOOSTER OUTPUT

FIELD OF THE INVENTION

The present invention relates to a signal processor; and, in more particular, to a nonlinear optical signal processor capable of performing amplification, commutation, switching, and computing of optical signals.

BACKGROUND OF THE INVENTION

There has been a growing demand for devices made of all-optical components for performing such functions as amplification, commutation, switching and computing of optical signals without having to go through intermediate electronic stages.

One of the approaches proposed is based on a system wherein optical signals exist at all stages of signal processing with sufficiently high speed performance and simple configuration, preferably, by employing semiconductor components. Steady developments have been made towards this direction during the last decade.

One of such devices is disclosed in an article by Toolay et al., "High Gain Signal Amplification in an InSb Transphaser at 77 K", *Appl. Phys. Letter*, 43, 9,807–809 (1983), comprising an optical nonlinear phase modulator with mirrors formed on an optically nonlinear semiconductor material, e.g., InSb(indium/antimony). It is possible to obtain with this device which utilizes the optical nonlinearity of InSb, the effect of "the light by light" amplification by introducing two beams into InSb; a powerful beam for pumping and a weak one for carrying the data, resulting in the modulation of one beam with another and the amplification of the data-carrying optical signal (OS) upto 40 dB. This device is also known as a nonlinear Fabry-Perot interferometer (FPI). The advantages of this device include its small-sized design, high nonlinear factor and high gain factor. There exist, however, certain deficiencies in this device such as: the need for an external or outer pumping source; a single input and a single output channels; and complicated input/output beams due to the structural peculiarities of the device; the necessity for complete frequency coincidence of the FPI and the input OS; and the device being essentially a laboratory mock-up whose practicality is still unknown.

The closest prior art device to the present invention, from the technical point of view, may be the one called, "Optical Transistor" as described in U.S. Pat. No. 5,001,523 issued on Mar. 19, 1991, which is capable of commutating and amplifying optical signals as well as selecting the radiation of various frequencies by channels.

The advantages of this devices reside in its high amplification factor, the potential for commutation or switching of optical signals, its small-sized design, and the use of resonance rings as integral optic elements which permits the use of resonators with a high quality factor. There exist, however, certain deficiencies in this device including: a limited channel accessibility, a low sensitivity level for the input channels, and the lack of a multi-level system for the processing of the optical signals, i.e., lack of storage and logic capability.

SUMMARY OF THE INVENTION

It is, therefore, a primary object of the present invention to provide an active optical signal processor, which is controllable by input optical signals; is fully accessible; possesses an increased number of optical ports or contacts for inputting or outputting optical energy; has a high input signal sensitivity level and high-power output signals; and has the ability to carry out a multi-level processing of optical signals as well as computing operations and storage functions.

In accordance with one aspect of the present invention, there is provided an optical processor, comprising:

- a pair of directional couplers formed from a pair of first waveguides, a pair of first electrodes and a pair of nonlinear circular resonators (NCRs), wherein each of the directional couplers is formed by optically coupling each of the first waveguides with each of the NCRs, each of the directional couplers being controlled by each of the first electrodes applied over a region of optical coupling between each of the first waveguides and each of the NCRs, and each of the NCRs having a pair of first semiconductor lasers and a multiplicity of second electrodes through which the NCR state changes are executed, each of the first semiconductor lasers being positioned in each of the NCRs in a region thereof outside the region of optical coupling;

- an optical transistor (OT), located between the pair of NCRs and incorporating an optical mixer of bifurcation optical active type capable of functioning as a phase modulator, including a second waveguide, a pair of second semiconductor lasers, a pair of third electrodes and a pair of mirrors, wherein each of the mirrors and each of the second semiconductors are located at each end portion of the second waveguide, each of the third electrodes for controlling the OT parameters runs parallel to the vertical axis of the second waveguide and the optical mixer is located between the pair of second semiconductor lasers; and

- a common reference electrode.

In the optical processor described above, in forming of each of the directional couplers by optically coupling each of the nonlinear circular resonators and each of the first waveguides, the nonlinear circular resonator and the first waveguide can be either physically joined together or physically separated from each other.

BRIEF DESCRIPTION OF THE DRAWINGS

The above and other objects and features of the present invention will become apparent from the following description of preferred embodiments given in conjunction with the accompanying drawings, wherein.

DETAILED DESCRIPTION OF THE PREFERRED EMBODIMENTS

Figure 1:
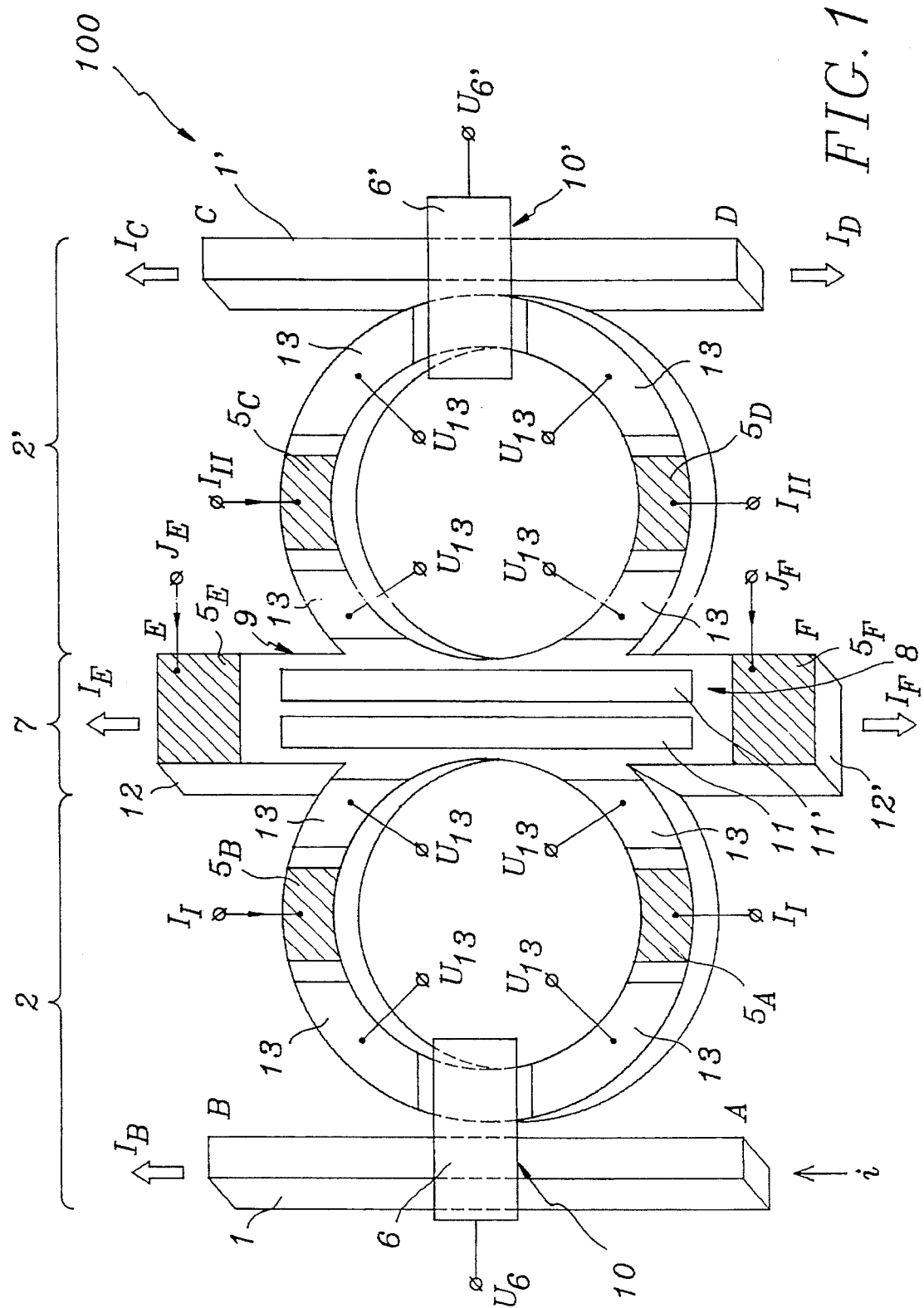
FIG. 1 shows a plan view of an optical processor in accordance with a preferred embodiment of the present invention.

The present invention provides a unified optical system through the functional unification or integration of the optical transistor and the electrically active optical bifurcation coupling of the laser-containing waveguides and the nonlinear circular resonator. The introduction of semiconductor lasers into the coupling regions, that is, the generation of a "direct" optical transistor (OT) with a phase modulator (PM) between the lasers in the region of coupling with the nonlinear circular resonator (NCR), effectively creates or generates mixers of the electrically active optical bifurcation (BOA) type that provide a number of new functions and benefits. Electrically active optical bifurcation is described in more detail in an article by Papuchon et al., "Electrically Active Optical Bifurcation" *Appl. Phys. Lett.*, 31, 4, 266–267 (1977).

The present invention allows the implementation of the multi-level processing of optical signals (OS) due to the multistability effect that is peculiar to the BOA/NCR structure. Optical signals can be inputted through any one of the optical contacts or ports and the output radiation can be picked-off from any one of the output channels as determined by the direction or way of the propagation of the radiation in the input optical transistor and the electrically active optical bifurcation coupling structure. The present invention allows the use of a single integrated or unified optical device to successively carry out optical signal processing, including amplification, storage, re-radiation of the amplified signal at any frequency, switching and commutation. These functional capabilities are conditioned by and a function of the several cascades of optical signal processing that can be generated in the device: the first (input) optical transistor has an effect on amplification; multi-level memory, generated by combining the electrically active optical bifurcation coupling and NCR, effects storage; and re-radiation of the optical signal at any frequency is effected by the second, output optical transistor with adjustment frequency of the $C^3$-laser, generated by two beams introduced into coupling waveguide. The present invention also allows the processing of low-power optical signals, having a low-power on the order of the magnitude of the noise level, which processing is possible due to the "preliminary amplification" cascade, i.e., the optical transistor. Low-intensity optical signals can be used to control various functions of the device including re-tuning, optical signal selection, and channel switching. These control characteristics become possible due to the amplification of the optical signal at the very first stage of processing and due to the non-linear properties of the phase modulator, the optical transistor, and the NCR interconnected with the intrinsic or internal characteristics of these functional cells, i.e., the phase modulator, the optical transistor, and the NCR.

The above-described advantages and functional characteristics are implemented by the optical transistor, the NCR, and the configuration of the NCR with the electrically active optical bifurcation coupling switch region.

The optical transistor basically allows the commutation/communication of optical signals with amplification of the optical signal or memorization of the optical signal as a function of the choice of the appropriate device characteristics and of the control signals applied to the electrodes. Optical transistor functions and characteristics are disclosed more fully in an article by Lomashevich et al., "Concept of Optical Transistor", *Journal of Applied Spectroscopy*, 55, 3, 485–490 (1991) and in USSR Inventor's Certificate No. 1225386, entitled "Optical Transistor" issued to Morozov et al.

In the present invention, the optical transistor is defined by two semiconductor lasers and a waveguide (which is a phase modulator placed between the lasers) to constitute the first non-linear cascade of amplification operating in the optical bistability mode. When an optical signal enters the phase modulator of the optical transistor and the light intensity exceeds a threshold value, anti-reflection or saturation of the optical transistor takes place due to the non-linear properties of the material-tuning to the resonance. If the dependence $n=n_0+n_2I_p$ (where $n_0$=the "dark" refractive index, $n_2$=the non-linearity factor, and $I_p$=the intensity in the resonator)is implemented, then upon attaining the threshold value of $I_p$, the influence of the addend becomes considerable, and the system automatically starts to tune toward and to resonance, this process arising in a rapid or avalanche-like manner and the characteristic being realized with large and substantial steepness to thereby provide the desired amplification factor at the very beginning or first stage of the processing of the optical signal.

The optical transistor is also used as a coupling element with the NCR by means of (a) electrical tuning of the phase modulator or (b) a control optical signal being coupled to any part of the optical radiation from the phase modulator into the NCR, for example, an amplified optical signal can be picked-off at the output mirrors of the optical transistor for parallel processing in other optical circuits.

As the phase modulator serves as a non-linear Fabry-Perot interferometer with a resonator incorporated therein, its optical path depends on the intensity of integrated radiation. The phase modulator changes the optical length of the large resonator and also changes its Q-factor, which leads to the change of the threshold current. Such re-tuning allows the device to pass through the generation threshold, i.e., to obtain a lasing or laser mode.

According to the optical transistor concept, the first amplification cascade (i.e., the phase modulator) basically realizes the function of matching; without the requirement for strict coincidence of the input signal and resonator frequencies, it allows to evoke such a response of the whole system so that under the influence of the input signal i, amplified in the phase modulator: $I_{PM}=G_1 i$, and of the signal which has passed through the feedback circuit and has been amplified in the semiconductor laser amplifier (SLA); $I_{SLA}=G_{01}G_1 i$ the refractive index of the resonator of the optical transistor changes, which finally gives the below presented function of the optical transistor:

$$I_{OT}=\frac{G_1 i}{1+(\tau_1 I-\theta_{01})^2} \qquad \text{Eq. (1)}$$

wherein $$\tau_1 = 1 + \frac{G_{01}}{1 + (I - \theta_{01})^2}$$

= the optical transistor transmission characteristic, $G_{01}$=the inner amplification gain factor of the optical transistor, $G_1$=the gain factor for the phase modulator $G_1=3/(3-\theta^2_1)$, $\theta_{01}$=the phase angle for detuning of the optical transistor, $\theta_1$=the phase angle for detuning of the phase modulator.

Additional proposal relating to the optical transistor concept is disclosed in an article by Lomashevich et al., "Concept of Optical Transistor", *Journal of Applied Spectroscopy*, 55, 3, 485–490 (1991).

The nonlinear circular resonator with its matching elements, i.e., directional couplers and active laser elements that simultaneously serve as semiconductor laser amplifiers, also represents an optical transistor (as disclosed in U.S. Pat. No. 5,001,523 described above) in which the relationship between the input optical signal i and the output optical signal I is described by the same formula Eq. (1), except for the change of the index "1" on index "2", but the gain factor G in the considered case reflects the transmission level from the electrically active optical bifurcation coupling into the NCR.

As stated earlier, the configuration of the NCR with the electrically active optical bifurcation coupling (BOA) switch provides for the new functional properties which are found in each of these elements separately, i.e., the new properties which cannot be found in either the electrically active optical bifurcation coupling switch or in the NCR. In the disclosed invention, the electrically active optical bifurcation coupling is a coupling element between the optical transistor (OT) and the nonlinear circular resonator.

The effect of optical bistability manifests itself in nonlinear media in which the index of refraction, n, is a function of and is dependent upon the intensity (i.e., the intensivity) of the optical energy in the media, $n=n_0+n_2 I_p$, and at the feedback present in the system. In the disclosed device, both the optical system as a whole (made of one and the same material exhibiting dispersion or absorption nonlinearity and nonlinear circular resonator-operated feedback) as well as its individual elements, e.g., the nonlinear circular resonator, in which the feedback is provided by the outer mirrors, meet the above requirements. See also Bystrov et al., "Optical Transistor as a New Functional Element of VOSP Technique," *Elektrosvyazj*, No. 1, 22–25 (1992). It is critical for the operation of the disclosed device that the initial response of the system to the input radiation, taking place in the input optical transistor, occurs in accordance with stalling, and, consequently, rapidly in time (on the order of picoseconds), and with very steep characteristics. Further, formation of the output signal is also effected by the system operating in the optical bistability mode. The sequence of preliminary amplification, amplification and power amplification is a simplified way of characterizing the successive formation of the output signals in the system. In the inventive system, each of the NCRs, being in optical contact with the optical transistor at a strong coupling level, pumps optical energy into itself, thus smoothing non-regular or non-periodic fluctuations associated with the separate waveguides and, vice versa, enlarging the effects, peculiar to the system and defined by the parameters which enable it to change the form of the characteristics and output data of the optical processor.

Figure 2:
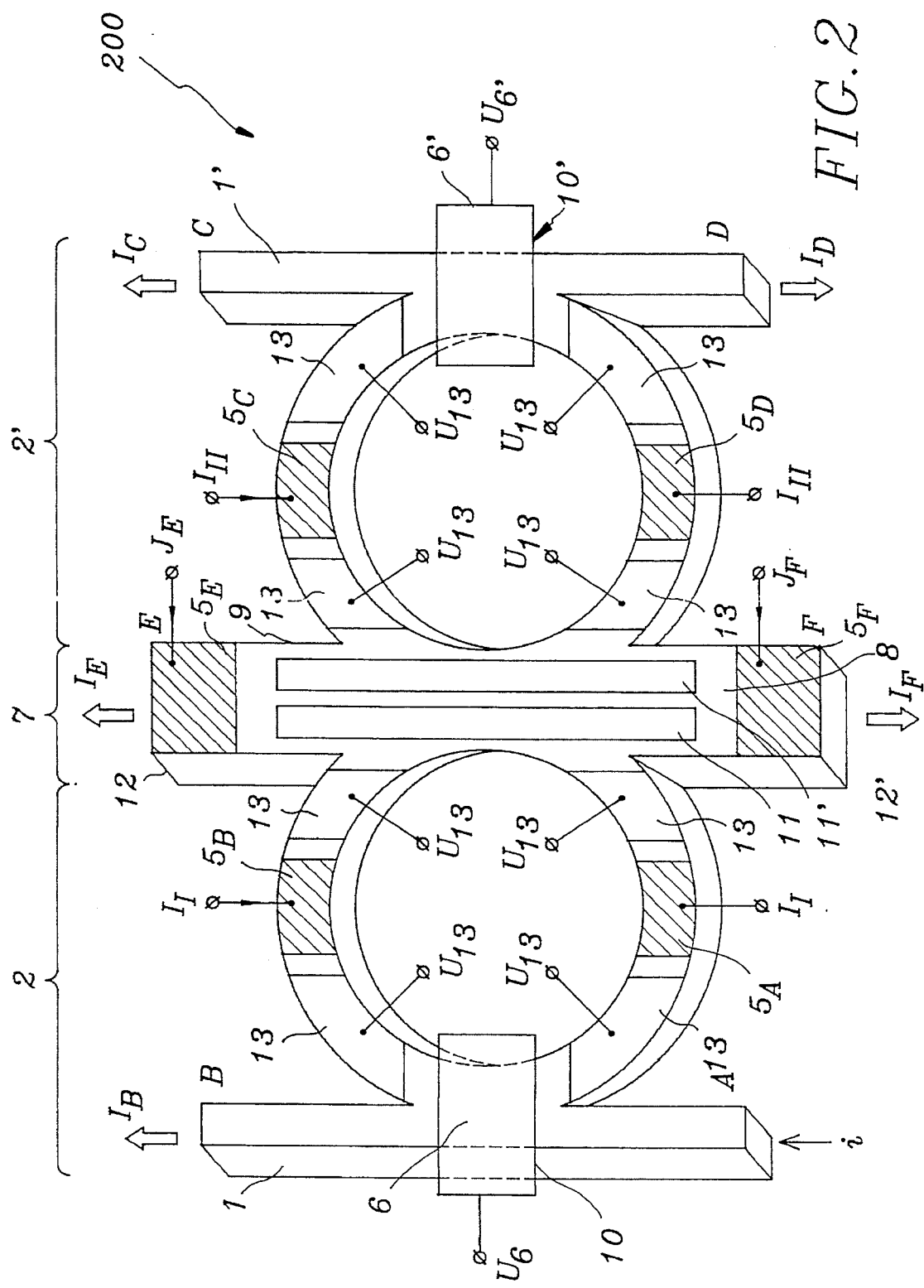
FIG. 2 illustrates a plan view of an optical processor in accordance with another preferred embodiment of the present invention.

In FIGS. 1 and 2 there are shown a plan view, respectively, of the two optical processors 100, 200 developed in accordance with preferred embodiments of the present invention, comprising:

a pair of directional couplers 10, 10' formed from a pair of first waveguides 1, 1', a pair of first electrodes 6, 6' and a pair of nonlinear circular resonators(NCR) 2, 2', wherein each of the directional couplers, e.g., 10, is formed by optically coupling the first waveguide 1 with the NCR 2, each of the directional couplers, e.g., 10, being controlled by the first electrode 6 applied over a region of optical coupling between the first waveguide 1 and the NCR 2, and each of the NCRs, e.g., 2, having a pair of first semiconductor lasers 5A, 5B and a multiplicity of second electrodes 13 through which the NCR state changes are executed, each of the first semiconductor lasers, e.g., 5A, being positioned in the NCR 2 in a region thereof outside the region of optical coupling;

an optical transistor(OT) 7, located between the pair of NCRs, 2, 2' and incorporating an optical mixer 8 of bifurcation optical active type capable of functioning as a phase modulator, including a second waveguide 9, a pair of second semiconductor lasers 5E, 5F, a pair of third electrodes 11, 11' and a pair of mirrors 12, 12', wherein each of the mirrors, e.g., 12, and each of the second semiconductors, e.g., 5E, are located at each end portion E of the second waveguide 9, each of the third electrodes, e.g., 11, for controlling the OT parameters runs parallel to the vertical axis of the second waveguide 9 and the optical mixer 8 is located between the pair of second semiconductor lasers 5E, 5F; and a common reference electrode (not shown).

In the optical processor described above, in forming of each of the directional couplers by optically coupling each of the nonlinear circular resonators and each of the first waveguides, the nonlinear circular resonator and the first waveguide can be either physically joined together, as shown in the optical processor 200, or physically separated from each other, as shown in the optical processor 100.

The operation of the optical processor 100 of the present invention will be described with reference to FIGS. 1 and 2. As all of the input-output optical contacts, A, B, C and D, are essentially identical, the following description will be given with respect to an input optical signal i entering the optical contact A in the optical waveguide 1.

A voltage $U_6$ applied to the first electrode 6 controls the switching of the optical signal in the NCR 2. By properly adjusting the voltage $U_6$, an amplification having the characteristic of a differential amplification is realized in an optical bistability cell, comprising the optical waveguide 1 and the NCR 2.

This is the first cascade of optical signal amplification, resulting in the initiation of the phase modulator(PM) 8 and in the transferring of the lasers 5E, 5F in the dormant mode to the laser generating mode, which will in turn sharply increase the intensity within the NCR 2, thereby forcing the material making up the NCR 2 to exhibit the nonlinear properties. As a result, the resonance of the NCR 2 will coincide with the input optical signal frequency and the radiation of a sufficient power to initiate phase modulation will enter the phase modulator 8. The laser beams from the pair of OT lasers 5E, 5F are captured and confined by the pair of mirrors 12, 12' and then are re-tuned to the resonance of the optical transistor 7(EF), which will allow the optical transistor 7(EF) to control the whole system as the phase modulator incorporated in the OT 7 serves as an optical mixer for the pair of NCRs 2, 2' in the system.

With every passing of the light beams between the pair of mirrors 12, coupling of the portions of the optical power to the NCRs 2, 2' takes place; and, by means of the directional couplers 10, 10', the amplified frequencies are taken out through the output contacts A, B, C and D. Most of the optical power is outputted through the pair of mirrors 12, 12' confining the optical transistor 7.

It should be emphasized that since the optical system, as a whole unit, operates in the waiting mode, the input signal entering the system must first re-tune the system to the resonance state thereof utilizing the nonlinear properties of the material constituting the system which exhibits the optical bistability effect, hence, the dependence of the refractive index, n, on the intensity as described in Eq. (1), in all stages of the optical signal processing in the directional couplers (AB-NCR 2, CD-NCR 2'); in the NCRs (NCR 2, NCR 2'); in the optical mixer 8; and in the optical transistor (EF). Since each of the inventive optical processors, shown in FIGS. 1 and 2, possesses an axial symmetry with respect to the optical mixer 8 of BOA type located between the pair of NCRs 2, 2', the characteristics of the output optical signal I can be obtained from the input i and parameters through the use of the following algorithm.

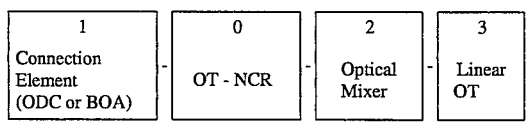

The base element of the optical system considered is the optical transistor with circular resonator (OT-CR) whose characteristics are described by the functions:

$$I = \frac{Ti}{1 + (\tau I - \theta_0)^2} \quad \text{Eq. (2)}$$

wherein:

$G_0$=the inner amplification gain factor of the optical transistor with a circular resonator, T=the gain factor for the phase modulator, G=the phase angle for detuning of the optical transistor with a circular resonator, I=the output optical signal intensity, and $$\tau = 1 + \frac{G_0}{1 + (I - \theta_0)^2}$$
= the transmission characteristics of the optical transistor with a circular resonator.

The directional coupler characteristics of the present invention are obtained from the equations describing the connected mode, wherein the system response for the positive feedback is taken into consideration by introducing the dependence of the equation on the difference between the constant for the spreading of the optical oscillation modes and the factor G value in the optical tract of the second channel, which, in this case, is the circular resonator. Additional disclosure relating to this concept can be found in an article by Scrapper et al., "Remotely Controlled Integrated Directional Coupler Switch", *IEEE Journal of Quantum Electrinics*, QE - 17, N3, 332 (1981).

In the optical bistability mode, the function ($F_1$) describing the power transfer from the band-pass waveguide to the NCR can be presented as:

$$\frac{i}{I} = F_1(I) = \left( \frac{\Delta\beta_1^2}{\sqrt{(G_0 I)^2 + \Delta\beta_1^2}} \text{Sin}^2 \sqrt{(G_0 I)^2 + \Delta\beta_1^2} \right) \quad \text{Eq. (3)}$$

$$\Delta\beta_1 = 2 G_0 I_{RR} + \Delta\beta_{01} \quad \text{Eq. (4)}$$

wherein, i=the intensity of the input radiation, $I_{RR}$=the intensity in the resonator, and $\Delta\beta_{01}$=the initial difference between constants of modes spreading.

A study of optical bistability in commutators or switches of the electrically active optical bifurcation (BOA) type is described more fully in Andreev et al., "Optical Bistable Commutating Device with Electronic Feedback", *Technicheski Sredstiva Svyazi*, Seria: Tekhn. Prov. Svyzi, Vypusk 6. S. 115– 121 (1984). According to Andreev, the transfer function of the BOA-mixer in OB mode is:

$$\tau^{-1} = \frac{d_2}{d_2 - \text{Cos}(\Delta\beta_2)} \quad \text{Eq. (5)}$$

wherein $d_2$ the parameter, characterising the maximum permissible level of the output, is defined by the coefficients for the decomposition of the input signal for the proper modes of mixer, described by the relation:

$$\Delta\beta_2 = \Delta\beta_{02} + G_0 I, \quad (6)$$

wherein, $\Delta\beta_0$ is the initial difference between the constants of modes spreading.

The transfer function for the input-output circuits of the optical system can be determined by taking into consideration the transfer function of the liner OT. Thereafter, the OP characteristics are described using the following:

$$I = \left[ \frac{1}{\sqrt{(G_0 I)^2 + \Delta\beta_1^2}} \text{Sin}^2 \sqrt{(G_0 I)^2 + \Delta\beta^2} \right]^{2} \quad \text{Eq. (7)}$$

$$\frac{i}{1 + (\tau I - \theta_0)^2} \quad \frac{d_2}{d_2 - \text{Cos}\Delta\beta_2} \left( 1 + \frac{G_{03}}{1 + (I - \theta_{03})^2} \right)$$

wherein each of the indices 0, 1, 2, 3 corresponds to the OT-CR, DC, BOA and linear OT, respectively.

Figure 3:
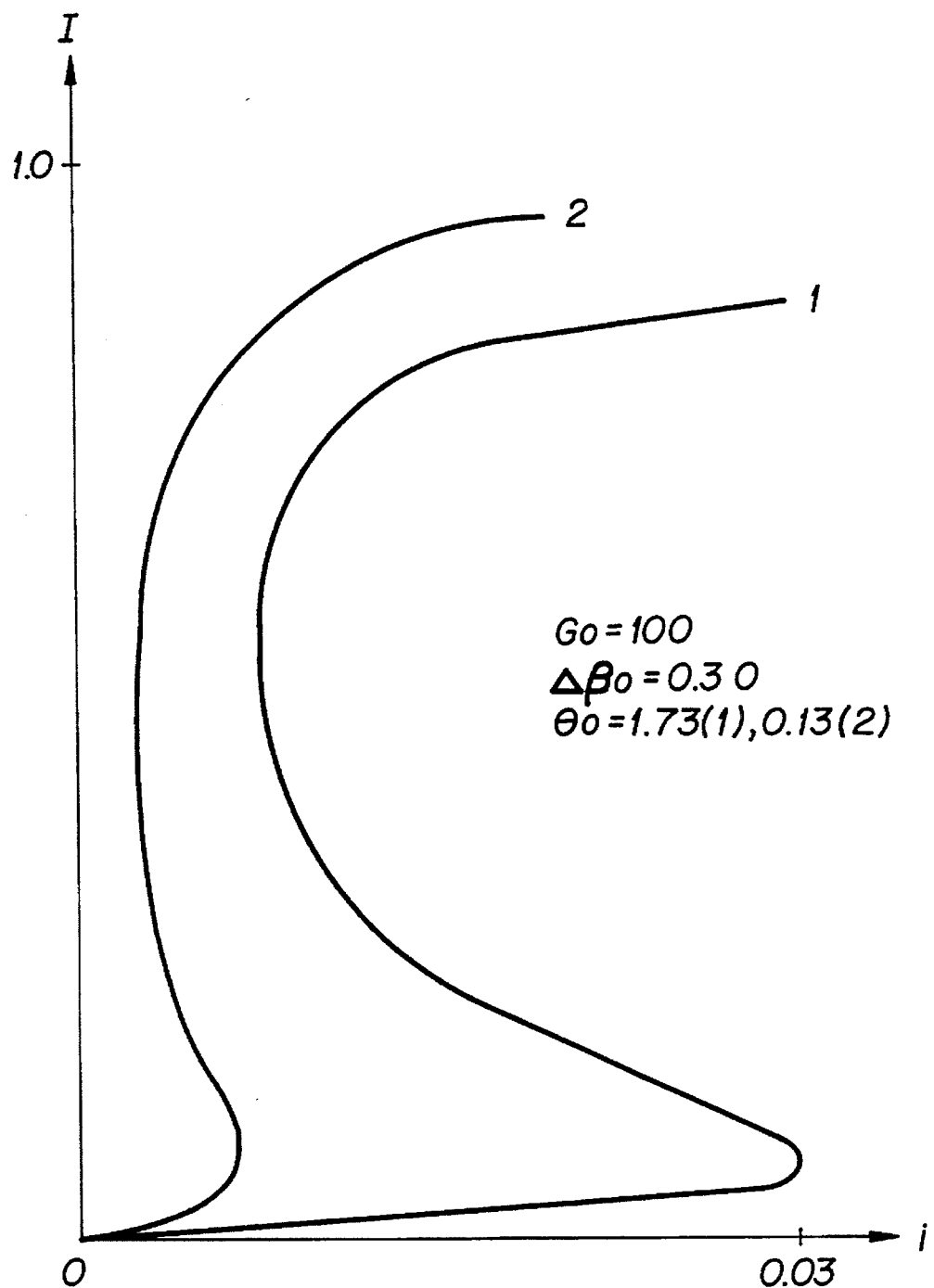
FIG. 3 represents the influence of the initial detuning of the optical transistor.
Figure 4:
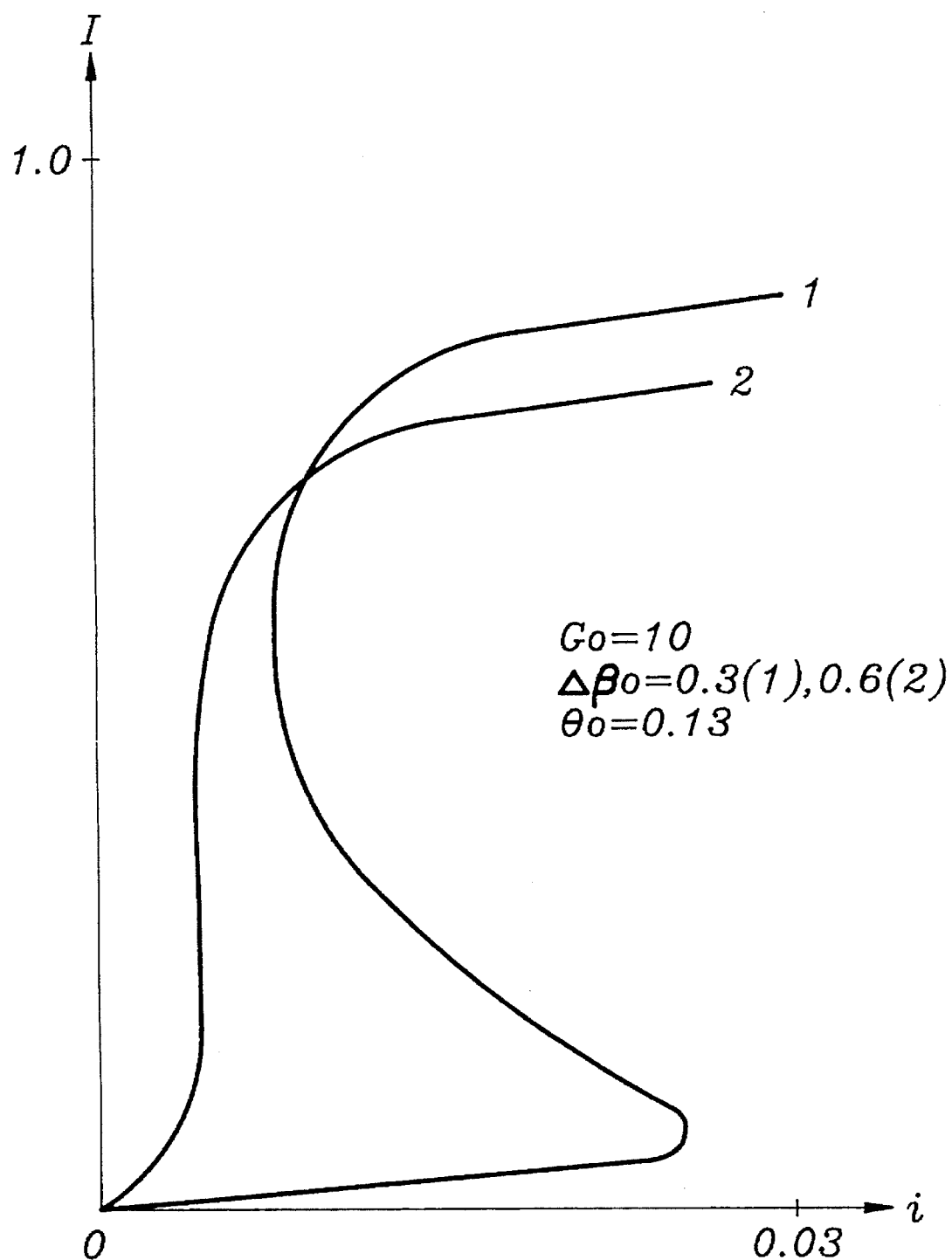
FIG. 4 describes the characteristics of the optical processor with a directional coupler.
Figure 5:
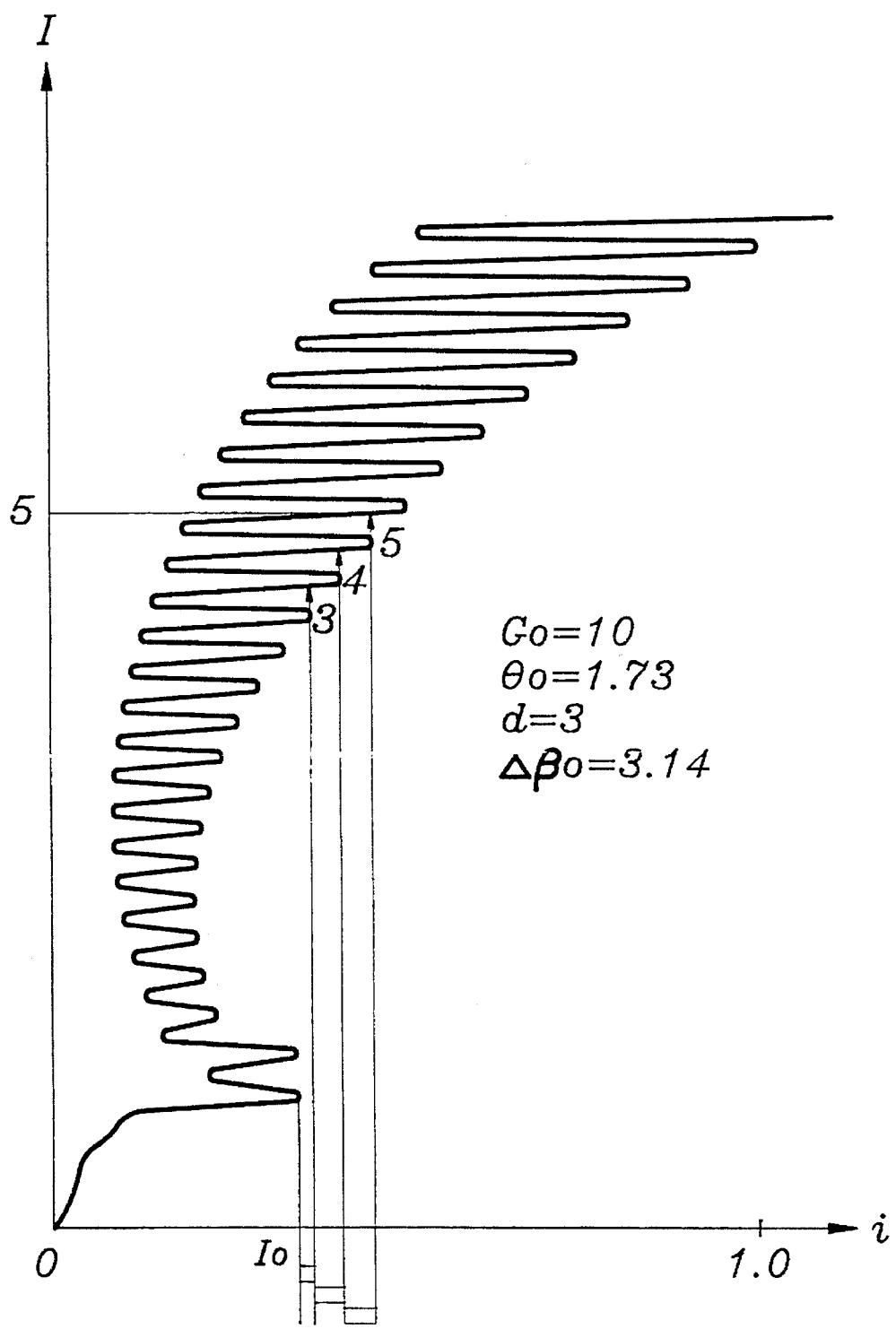
FIG. 5 depicts the memorizing process.

The results shown in FIGS. 3, 4 and 5 confirm that in such an optical system the following modes can be realized:

the optical memory mode (FIG. 3, 4);

the differential amplification mode (FIG. 4, curve 2); and the optical processor mode.

Accordingly, the optical system is capable of: providing the successive addition of optical signals and memorizing the results thereof; memorizing the definite value and adding inputted optical signals thereto and memorizing the results thereof (points 3, 4, 5 etc. on FIG. 5); and adding optical signals, inputted in different optical contacts, and memorizing the results thereof.

The alternation of functional properties and characteristics of the device is attained by changing the parameters.

In describing the embodiment shown in FIG. 2, previously defined transfer functions of the separate elements of the optical processor can be used to obtain the dependence between input i and output I:

$$I = \frac{d_1}{d_1 - \cos\Delta\beta_1} \frac{i}{1 + (\tau I - \theta_0)^2} \frac{d_2}{d_2 - \cos\Delta\beta_2} \left(1 + \frac{G_{03}}{1 + (I - \theta_{03})^2}\right) \quad \text{Eq. (8)}$$

wherein each of the indices designates the following:

0=the OT-CR,

1=the BOA-mixer,

2=the optical mixer (3) (FIG. 2), and

3=the linear OT.

Figure 6:
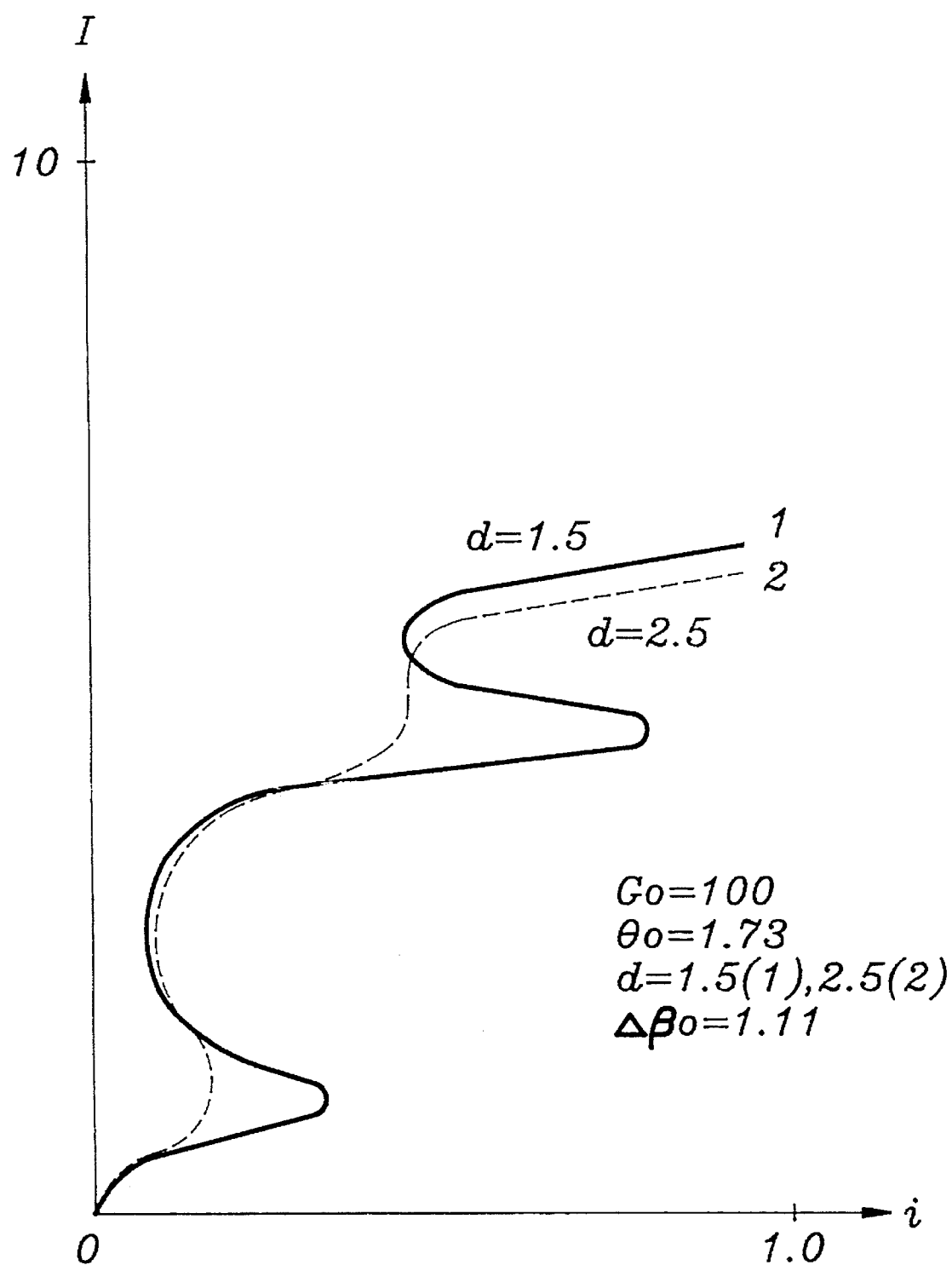
FIG. 6 exhibits the change in the characteristic of the optical bistability as a function of an increasing d factor.
Figure 7:
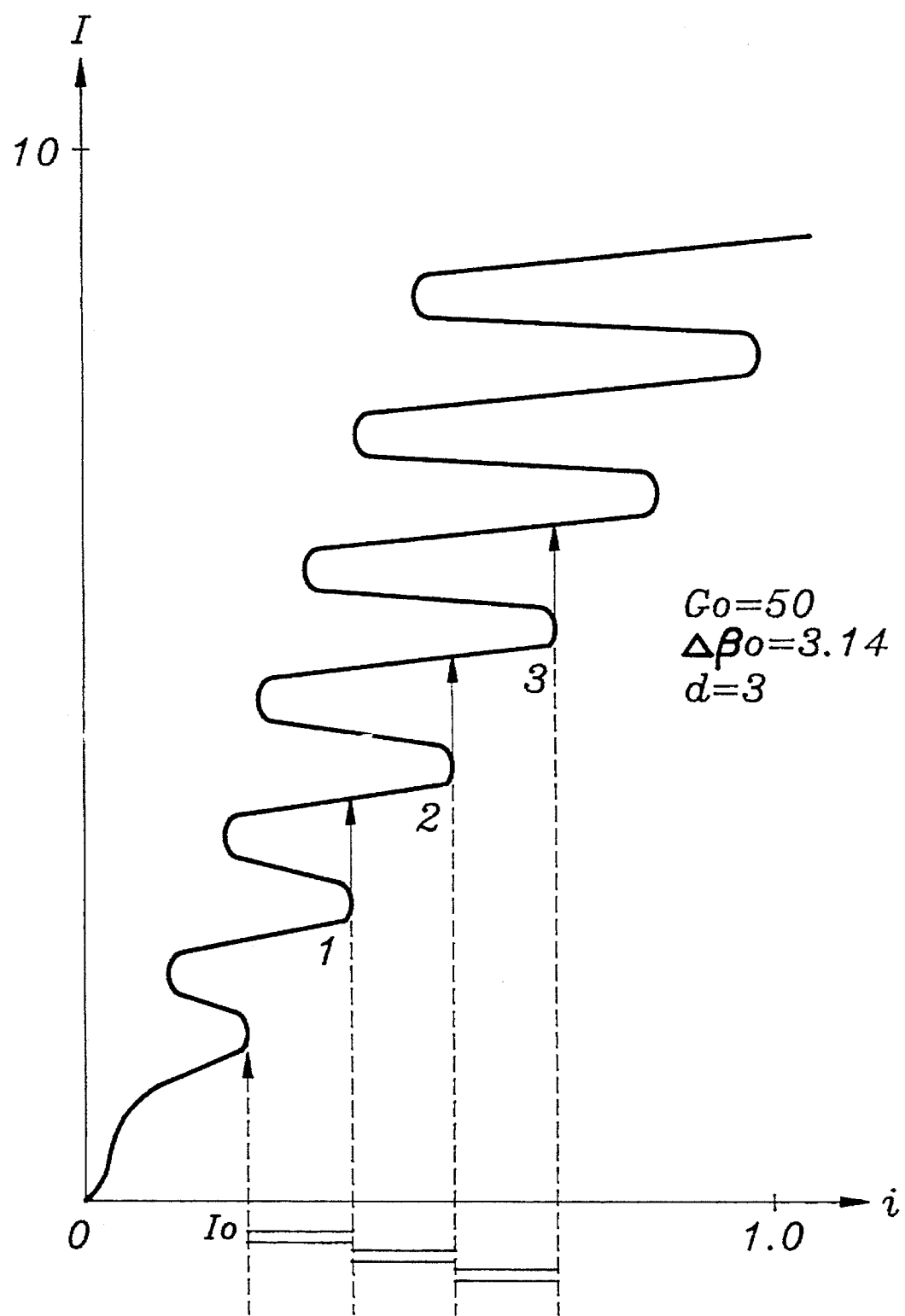
FIG. 7 presents the calculation procedure of the present invention.
Figure 8:
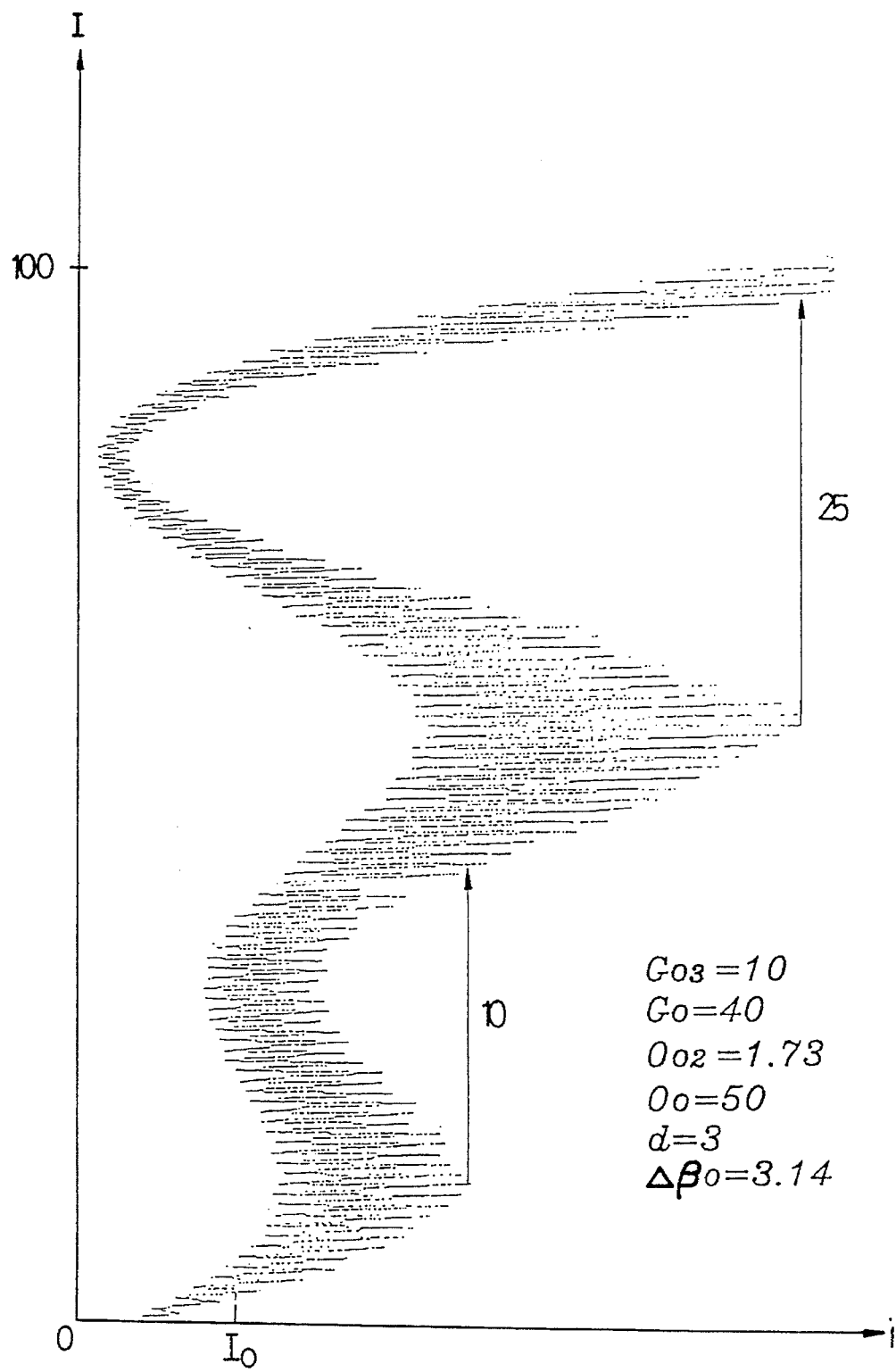
FIG. 8 provides the capability of the optical processor to carry out computations using the multistable characteristics of the present invention.

From the results of the analysis, it can be seen that the following operating modes are possible in OP with the input BOA mixer:

- optical memory in the first order and differential amplification in the second order when d=2.5 (curve 2, FIG. 6); multi-stable memory when d=1.5 (curve 1, FIG. 6);
- the addition of OS, the forming of orders of the values and memory when d=1.5 (curve 1, FIG. 6);
- the addition of OS on the multistable characteristic (FIG. 7); and
- the addition of OS, the forming of orders of the values and memorizing of these values (FIG. 8).

Figure 9:
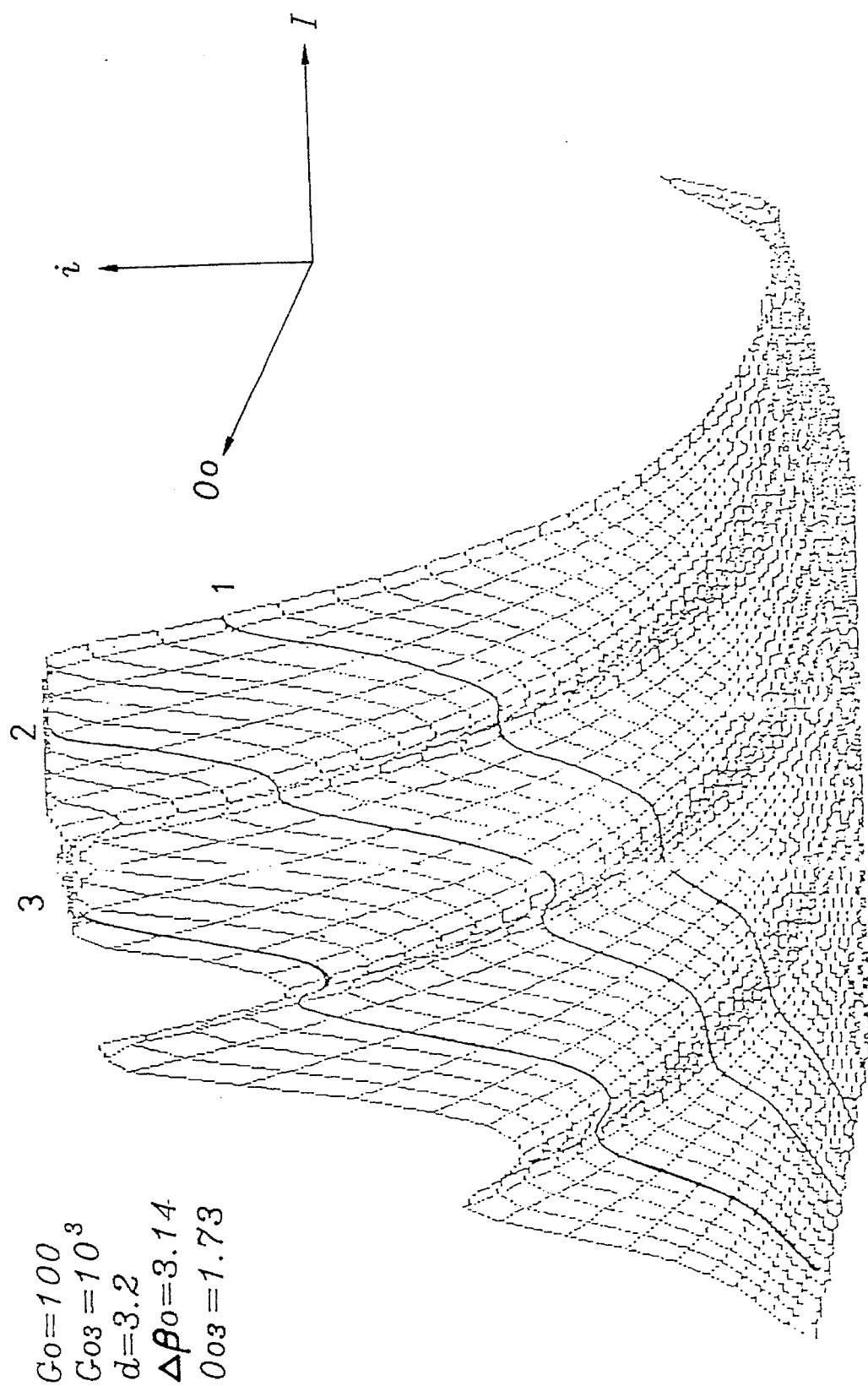
FIG. 9 is the bifurcation surface of the optical processor having BOA.

The variety of characteristics and modes are illustrated by bifurcation surface I=f(i,$\theta_0$) (FIG. 9), on which the following characteristic are indicated: amplification-multi-stability (curve 1), and multi-stability with the altering of square of hysteresis (curves 2 and 3, FIG. 9). It can be seen that the influence of parameter is obvious from this figure.

The other parameters, enabling to re-tune the device to the different modes and to realize various form of characteristics, are $d_1, d_2, \Delta\beta_{01}, \Delta\beta_{02} G_0, G_{03}, \theta_0, \theta_{03}$ Thus, the input OS, entering through any one of the optical contacts causes the retuning of the whole optical system in the resonance direction and the initiation of the optical histability effect in the separate cells, as well as in the whole system. This results in: forcing the lasers into a laser generating mode; increasing the radiation intensity sharply in the system; capturing of this radiation by 0T mirrors; and amplification and distribution of optical power through the output channels. Furthermore, the multi-stable characteristic is realized by proper parameter values enabling the optical system to carry out the process of addition of the values, given by optical signals. Memorizing of the previously amplified input impulses, addition, memorizing the results thereof and the transferring thereof to the next order (on intensity) are all accomplished in the calculation mode.

Representative materials used for the manufacture of the disclosed device include three-component systems (for example, GaAlAs), and four-component systems (for example, InGaAsP) solid solutions, compositions of which depend on the range of overlaying wavelengths of optical radiation. Technical processes for the fabrication of the optical processor include liquid, gas-phase, moshydrate and molecular-beam epitaxy.

Design and structures of the active cells of the optical processor in its combined (hybrid) version can be manufactured using the above mentioned technological processes; and may be installed into etched windows in the circular resonator and waveguides using an In-based solder.

As to the integrated-optical version, the following structures are proposed. Lasers on the double heterostructure; the most simple variant is implemented by generation of an active layer distributed over the circular resonator and waveguides. Vertical formation of the active layer occurs together with the heterostructure growth; planarwise the active layer is limited by the size of contact pads, which repeat the form of the elements of the processor. Alternatively, the limitation can be implemented by manufacturing a narrow active layer in an immersed masked heterostructure. In the integrated-optical version, mirrors may be manufactured in the form of distributed feedback using the process of holographic lithography accompanied by chemical etching. The above designs can be implemented using quantum-sized structures.

The main advantages of the inventive device are as follows: the ability to carry out logical operations and computations with optical impulses and to effect storage in a multi-level mode; the ability to control various functions of the optical processor using parameters determined by the dependent relationship i=f(I) and desirably subordinated to electric control via the electrodes of the device; the manner by which input optical signals are introduced into the phase modulator of the optical transistor avoids the strict coincidence of optical signal frequencies and tuning frequencies of optical transistor; a high amplification factor (above 40 dB), high responsivity, and suppression of non-regular fluctuations are achieved; full accessibility and four optical outputs; and the ability to commutate or switch optical signals with amplification.

While the present invention has been described with respect to certain preferred embodiments only, other modifications and variations may be made without departing from the scope of the present invention as set forth in the following claims.

What is claimed is:

1. An optical processor, including:

a pair of first waveguides;

a pair of first directional couplers;

a second waveguide;

a pair of second directional couplers;

a pair of nonlinear ring resonators optically coupled to respective ones of said first waveguides through respective ones of said first directional couplers, each of said first directional couplers being provided with means for adjusting the optical coupling between a respective one of said nonlinear ring resonators and a respective one of said first waveguides, each of said nonlinear ring resonators further being optically coupled to said second waveguide through said second directional couplers, and each of said second directional couplers being provided with means for adjusting the optical coupling between a respective one of said nonlinear ring resonators and said second waveguide;

wherein each of said first waveguides are provided with input and output optical contacts;

wherein each of said nonlinear ring resonators comprises:

a pair of first lasers positioned at opposite end portions thereof;

a plurality of first mirrors configured to form resonant cavities for said first lasers; and, first means for controlling said first lasers and selected portions of each of said nonlinear ring resonators intermediate said first lasers and said first directional couplers; and, wherein said second waveguide comprises:
    a pair of second lasers positioned at opposite end portions of said second waveguide;
    a plurality of second mirrors configured to form resonant cavities for said second lasers;
    a phase modulator provided between said pair of second lasers and said pair of second directional couplers, said phase modulator being bounded by a plurality of third mirrors and serving as a Febry-Perot interferometer;
    second means for controlling said second lasers and said phase modulator; and,
wherein an input optical signal introduced into a selected one of said first waveguides is coupled to a respective one of said nonlinear ring resonators via a respective one of said first directional couplers, and amplified, under the control of a switching signal applied to a respective one of said adjusting means, said amplified input optical signal initiating operation of said phase modulator and lasing of said second lasers.

2. The optical processor as set forth in claim 1, wherein said first waveguides are disconnected from respective ones of said nonlinear ring resonators.

3. The optical processor as set forth in claim 2, wherein said first and second lasers and said phase modulator are made of the same semiconductor material.

4. The optical processor as set forth in claim 2, wherein said first and second lasers and said phase modulator are made of different semiconductor materials.

5. The optical processor as set forth in claim 2, wherein said first means includes means for adjusting current and/or voltage applied thereto.

6. The optical processor as set forth in claim 5, wherein said second means includes means for adjusting current and/or voltage applied thereto.

7. The optical processor as set forth in claim 6, wherein said adjusting means of said each of said first and second directional couplers includes means for adjusting current and/or voltage applied thereto.

8. The optical processor as set forth in claim 7, wherein each of said first and second lasers includes a multiplicity of quantum well active layers.

9. The optical processor as set forth in claim 1, wherein said first, second, and third mirrors are each formed in the shape of a distributed Bragg mirror.

10. The optical processor as set forth in claim 9, wherein said first waveguides are disconnected from respective ones of said nonlinear ring resonators.

11. The optical processor as set forth in claim 10, wherein said first and second lasers and said phase modulator are made of the same semiconductor material.

12. The optical processor as set forth in claim 10, wherein said first and second lasers and said phase modulator are made of different semiconductor materials.

13. The optical processor as set forth in claim 10, wherein said first means includes means for adjusting current and/or voltage applied thereto.

14. The optical processor as set forth in claim 13, wherein said second means includes means for adjusting current and/or voltage applied thereto.

15. The optical processor as set forth in claim 14, wherein said adjusting means of said first and second directional couplers each includes means for adjusting current and/or voltage applied thereto.

16. The optical processor as set forth in claim 15, wherein each of said first and second lasers includes a multiplicity of quantum well active layers.

17. The optical processor as set forth in claim 1, wherein each of said nonlinear ring resonators and said second waveguide are disconnected.

18. The optical processor as set forth in claim 1, wherein each of said nonlinear ring resonators and said second waveguide are joined together.

19. An optical processor, including:
    a first waveguide;
    a first directional coupler;
    a second waveguide;
    a second directional coupler;
    a nonlinear ring resonator optically coupled to said first waveguide through said first directional coupler, said first directional coupler being provided with means for adjusting the optical coupling between said nonlinear ring resonator end said first waveguide, said nonlinear ring resonator further being optically coupled to said second waveguide through said second directional coupler, and said second directional coupler being provided with means for adjusting the optical coupling between said nonlinear ring resonator and said second waveguide;
    wherein said first waveguide is provided with input and output optical contacts;
    wherein said nonlinear ring resonator comprises:
        a pair of first lasers positioned at opposite end portions of said nonlinear ring resonator;
        a plurality of first mirrors configured to form resonant cavities for said first lasers; and,
        first means for controlling said first lasers end selected portions of said nonlinear ring resonator intermediate said first lasers end said first directional coupler; and,
    wherein said second waveguide comprises:
        a pair of second lasers positioned at opposite end portions of said second waveguide;
        a plurality of second mirrors configured to form resonant cavities for said second lasers;
        a phase modulator provided between said pair of second lasers and said second directional coupler, said phase modulator being bounded by a plurality of third mirrors and serving as a Fabry-Perot interferometer;
        second means for controlling said second lasers and said phase modulator; and
    wherein an input optical signal introduced into said first waveguide is coupled to a nonlinear ring resonator via said first directional coupler, and amplified, under the control of a switching signal applied to said adjusting means, said amplified input optical signal initiating operation of said phase modulator and lasing of said second lasers.

20. The optical processor as set forth in claims 1 or 19, wherein each of said selected portions of said nonlinear ring resonator intermediate said first lasers and said first directional coupler comprises an electrode.

* * * * *